US007736993B2

(12) United States Patent
Allibert et al.

(10) Patent No.: US 7,736,993 B2
(45) Date of Patent: Jun. 15, 2010

(54) COMPOSITE SUBSTRATE AND METHOD OF FABRICATING THE SAME

(75) Inventors: Frédéric Allibert, Grenoble (FR); Sébastien Kerdiles, Saint Ismier (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 804 days.

(21) Appl. No.: 11/473,404

(22) Filed: Jun. 23, 2006

(65) Prior Publication Data
US 2007/0170503 A1 Jul. 26, 2007

(30) Foreign Application Priority Data
Jan. 23, 2006 (FR) ................................ 06 00594

(51) Int. Cl.
*H01L 21/30* (2006.01)
(52) U.S. Cl. ................................ 438/455; 257/E21.122
(58) Field of Classification Search .................. 438/142, 438/149–166, 455, 456, 457, 458, 459; 257/E21.119, 257/E21.12, E21.121, E21.122, E21.123
See application file for complete search history.

(56) References Cited
U.S. PATENT DOCUMENTS

| 4,891,684 | A | * | 1/1990 | Nishioka et al. ............. 361/313 |
| 6,028,012 | A |   | 2/2000 | Wang ........................... 438/779 |

(Continued)

FOREIGN PATENT DOCUMENTS

| EP | 0975 011 A1 | 1/2000 |
| EP | 1 087 041 A1 | 3/2001 |
| WO | WO 03/103057 A1 | 12/2003 |
| WO | WO 2005/014895 A1 * | 2/2005 |

OTHER PUBLICATIONS

Schjolberg-Henriksen, K. et al., "Oxide Charges Induced by Plasma Activation For Wafer Bonding", Sensors and Actuators, vol. A 102, pp. 99-105 (2002).

(Continued)

*Primary Examiner*—Sue Purvis
*Assistant Examiner*—Kevin Quinto
(74) *Attorney, Agent, or Firm*—Winston & Strawn LLP

(57) ABSTRACT

The invention specifically relates to methods of fabricating a composite substrate by providing a first insulating layer on a support substrate at a thickness of $e_1$ and providing a second insulating layer on a source substrate at a thickness of $e_2$, with each layer having an exposed face for bonding; providing plasma activation energy in an amount sufficient to activate a portion of the thickness of the face of the first insulating layer $e_{mp1}$ and a portion of the thickness of the face of the second insulating layer $e_{mp1}$; providing a final insulating layer by molecular bonding the activated face of the first insulating layer with the activated face of the second insulating layer; and removing a back portion of the source substrate while retaining an active layer comprising a remaining portion of the source substrate bonded to the support substrate with the final insulating layer interposed therein to form the composite substrate. The thicknesses $e_1$, $e_2$ of the first and second insulating layers are sufficient to provide the final insulating layer with a thickness of 50 nanometers or less, and the plasma activation energy and respective thicknesses $e_1$, $e_2$ of the first and second insulating layers are selected such that only respective thicknesses $e_{mp1}$ and $e_{mp2}$ of the faces of the first insulating layer and the second insulating layer are activated.

21 Claims, 4 Drawing Sheets

U.S. PATENT DOCUMENTS

| | | |
|---|---|---|
| 2002/0137265 A1 | 9/2002 | Yamazaki et al. ............ 438/150 |
| 2002/0146895 A1* | 10/2002 | Ramdani et al. ............ 438/497 |
| 2003/0219957 A1 | 11/2003 | Kuwabara et al. ............ 438/400 |
| 2004/0031979 A1 | 2/2004 | Lochtefeld et al. ............ 257/233 |
| 2004/0175901 A1 | 9/2004 | Hadji et al. ............ 438/458 |
| 2004/0187769 A1 | 9/2004 | Aoki ............ 117/95 |
| 2005/0112845 A1 | 5/2005 | Ghyselen et al. ............ 438/455 |
| 2005/0176186 A1* | 8/2005 | Lee et al. ............ 438/157 |
| 2005/0202658 A1 | 9/2005 | Neyret ............ 438/517 |
| 2005/0245049 A1 | 11/2005 | Akatsu et al. ............ 438/458 |
| 2005/0269671 A1 | 12/2005 | Faure et al. ............ 257/618 |

OTHER PUBLICATIONS

Green, et al., "Ultrathin (<4nm) $SiO_2$ and Si-O-N gate Dielectric Layers for Silicon Microelectronics: Understanding The Processing, Structure And Physical And Electrical Limits", Journal of Applied Physics, vol. 90, No. 5, pp. 2001-2121 2086 (2001).

Sakaguchi, K., et al., "Eltran® by Splitting Porous Si Layers", The ElectroChemical Society Inc. PV99-3, Silicon-on-insulator technology and devices, P.L. Hemment, pp. 116-121, (1996).

Maleville, C., et al., "Smart Cut™ Technology: From 300 nm Ultrathin SOI Production To Advanced Engineered Substrates", Solid State Electronics, vol. 48, pp. 1055-1063 (2004).

Austrian Search Report corresponding to Singapore Appln. No. 200608374-5, (2008).

* cited by examiner

COMPOSITE SUBSTRATE AND METHOD OF FABRICATING THE SAME

TECHNICAL FIELD

The present invention relates to a method of fabricating a composite substrate comprising an insulating layer that is buried. The insulating layer is, for example, interposed between a semiconductor support substrate and an active layer of semiconductor material. More precisely, the present invention relate to a method of obtaining a composite substrate, wherein the insulating layer is thin, for example, less than 50 nanometers (nm) thick, or even less than 20 nm thick, with substantially improved electrical properties. Such a substrate can be used in particular in the fields of optics, electronics, and optoelectronics.

A particular but non-limiting example of that type of composite substrate is a substrate known by its acronym Silicon On Insulator (SOI), which designates a substrate comprising a layer of insulating silicon oxide interposed between two layers of silicon.

BACKGROUND ART

FIGS. 1A to 1E illustrate the various steps of one mode of fabricating an SOI type substrate, which is known in the art.

As shown in FIGS. 1A and 1B, the prior art method consists of oxidizing a source substrate Sou to form a layer of oxide Oxy at its surface, and then to carry out atomic species implantation to define an active layer Cact. The oxide layer is generally fairly thick, of the order of 150 nanometers (nm).

After bonding to a support substrate Sup (FIG. 1C) and detaching the remainder of source substrate Sou (FIG. 1D), a composite substrate is obtained comprising an oxide layer Oxy interposed between support Sup and an active layer Cact, arranged such that oxide layer Oxy has a contact interface with each of the latter, with respective reference numerals $I_1$ and $I_2$.

Finally, after fabrication, a protective layer may be formed on an upper surface of the composite substrate obtained, a layer intended to protect the upper surface during finishing heat treatments on the composite substrate. FIG. 1E depicts the composite substrate covered with a protective layer Cpr and there is an interface $I_3$ between protective layer Cpr and active layer Cact.

From the prior art, methods are already known which can improve, i.e. reduce, Density of Interface Trap (DIT) values, at certain interfaces of a composite substrate. They are principally heat treatments.

One of them, known as Forming Gas Anneal (FGA), consists of carrying out a repair/recovery heat treatment of interfaces at a low temperature, on the order of 450° C., in an atmosphere containing hydrogen and a neutral gas.

When such a method is carried out at 450° C., however, the improvement to the DIT value provided by the method is exerted solely on interface $I_3$ between protective layer Cpr and active layer Cact. The method does not appear to improve DIT values at interfaces $I_1$ and $I_2$, or if it does it is only very slightly. The FGA treatment method loses effectiveness at each interface that is encountered. Thus, the FGA treatment is relatively ineffective for deep-lying interfaces.

A further possibility consists of carrying out an annealing heat treatment at high temperature, i.e. over 900° C. or even over 1000° C.. Such a treatment may improve the DIT value at interface $I_2$, but has almost no effect on deeper lying interface $I_1$.

Further, in many prior applications, a thin buried insulating layer (oxide) is desired, for example less than 50 nm, or even less than 20 nm. In that case, the oxide no longer plays the role of electrical insulator alone, but forms an integral part of electronic components that are to be formed on the surface of the composite substrate.

Furthermore, support Sup, located at the bottom, no longer has only a mechanical function, but also has an electrical function. The support substrate Sup may optionally contain buried structures, for example a ground plane, or it may be a composite substrate. As a result, improvements to the DIT values at the two interfaces $I_1$ and $I_2$, located on either side of the buried insulating layer, are desirable.

It is well known that producing composite substrates comprising a very thin buried insulating layer is difficult. Hence, for example, for an SOI type substrate, it is known that the thinner the oxide layer, the higher the number of defects inside the final substrate. This is principally due to the presence of contaminants, polluting particles and gas, encapsulated during bonding at the interface $I_1$.

To improve that bonding, one solution consists of plasma activation of at least one of the surfaces to be bonded, namely that of support Sup and/or insulator Oxy. A high bonding energy is thus obtained, close to 1 joule/meter$^2$ (J/m$^2$), at interface $I_1$, even after an anneal at 200° C. for just 2 hours. But plasma activation deteriorates the electrical characteristics of interface $I_1$, and in particular its DIT values, fairly significantly. Reference in this regard is made to the article by K Schjölberg-Henriksen et al, "*Oxide charges induced by plasma activation for wafer bonding*", Sensors and Actuators A 102 (2002), 99-105, which shows the negative effect of plasma activation on the electrical properties of substrates. Thus, improvements in such treatments are desired and necessary.

SUMMARY OF THE INVENTION

The present invention overcomes the disadvantages of the prior art by providing new and useful methods of producing a composite substrate that includes a buried insulating having improved electrical properties. Improving a charge density (known by the abbreviation "Qbox") in the buried insulating layer is desirable. The present invention can be used to obtain a value of less than $5\times10^{11}$ charges per cm$^2$ for Qbox.

An improvement in a breakdown voltage, i.e. the voltage beyond which the resistivity of the insulator falls sharply, by obtaining a maximum value for the breakdown voltage is desirable. As an example, for a buried silicon oxide layer, a preferred value close to 10 megavolts/centimeter (MV/cm) is possible with the present invention.

The present invention improves the mobility of holes and/or electrons in the active layer. As an illustrative example, it is desirable and possible to obtain an electron mobility of more than 500 centimeter$^2$·volt$^{-1}$·second$^{-1}$ (cm$^2$·V$^{-1}$·s$^{-1}$) in silicon doped with boron in a concentration of the order of $10^{15}$ atoms/cm$^3$ with the present invention.

The Density of Interface Trap (DIT) value designates a density of traps at an interface between two layers. In the present invention, an improvement in DIT values at respective interfaces of the buried insulating layer with the neighboring layers is sought and desirable.

The remainder of the description focuses on the DIT value, as it is one of the principal parameters on which the substrate formation steps of the present invention have an influence. Further, the DIT parameter has an effect on electron mobility. The present invention improves the electrical performances of the final composite substrate.

Traps have the capacity to retain or release charge carriers at interfaces. They have an extremely deleterious impact on the electrical properties of electronic components that are to be produced on the composite substrate. The density of traps at an interface is expressed as the number of traps/eV·cm$^2$. The higher the DIT value, the worse the electrical properties of the substrate. As an example, a value of $10^{12} \cdot eV^{-1} \cdot cm^{-2}$ is a high value that corresponds to poor electrical properties for the substrate. Currently, the best DIT values obtained are of the order of $10^{10} \cdot eV^{-1} \cdot cm^{-2}$ for interfaces between very good quality oxides, known as "gate oxides" and their support. Such oxides are found, for example, in transistors, memories, capacitances and other types of components forming integrated circuits.

The present invention overcomes the above-mentioned disadvantages regarding the prior art. More precisely, the present invention provides a method of obtaining a composite substrate with a thin buried insulating layer, i.e. thinner than 50 nm, or even thinner than 20 nm, and which may even be as thin as 5 nm, with good electrical properties, i.e. with low DIT values at the two interfaces of the insulating layer.

Other advantageous and non-limiting characteristics of the present invention, taken alone or in combination, are listed below.

The invention specifically relates to methods of fabricating a composite substrate by providing a first insulating layer on a support substrate at a thickness of $e_1$ and providing a second insulating layer on a source substrate at a thickness of $e_2$, with each layer having an exposed face for bonding; providing plasma activation energy in an amount sufficient to activate at least one of a portion of the thickness of the face of the first insulating layer $e_{mp1}$ or a portion of the thickness of the face of the second insulating layer $e_{mp2}$; providing a final insulating layer by molecular bonding the face of the first insulating layer with the face of the second insulating layer; and removing a back portion of the source substrate while retaining an active layer comprising a remaining portion of the source substrate bonded to the support substrate with the final insulating layer interposed therein to form the composite substrate. The thicknesses $e_1$, $e_2$ of the first and second insulating layers are sufficient to provide the final insulating layer with a thickness of 50 nanometers or less, and the plasma activation energy and respective thicknesses $e_1$, $e_2$ of the first and second insulating layers are selected such that only at least one of the respective thicknesses $e_{mp1}$ and $e_{mp2}$ of the faces of the first insulating layer and the second insulating layer is activated.

In a preferred embodiment, the plasma activation energy is provided in an amount sufficient to activate the thickness portions of each of the first and second insulating layers, with both respective thicknesses $e_{mp1}$ and $e_{mp2}$ of the faces of the first insulating layer and the second insulating layer are activated. Also, $d_1$ and $d_2$ advantageously correspond to the respective tunneling distances of the first and the second insulating layers, and the following relationships are satisfied:

$e_1 \geq e_{mp1} + d_1$ and $e_2 \geq e_{mp2} + d_2$.

In a preferred embodiment, the first and second insulating layers have density of interface trap (DIT) values of $10^{11}$ eV$^{-1}$·cm$^{-2}$ or less, or several $10^{10}$ eV$^{-1}$·cm$^{-2}$ or less at their interfaces with the support and source substrates, respectively, when the support and source substrates comprise silicon, and the first and second insulating layers comprise silicon dioxide ($SiO_2$).

The method can include the first insulating layer, the second insulating layer, or both layers comprising an oxide that is formed or deposited on the support substrate, the source substrate, or both substrates, respectively. The oxide can be obtained by thermal oxidation.

The method can include the first insulating layer, the second insulating layer, or both layers comprising a high permittivity dielectric material that is formed or deposited on the support substrate, the source substrate, or both substrates, respectively. The high permittivity dielectric material can comprise one or more of hafnium dioxide ($HfO_2$), yttrium oxide ($Y_2O_3$), strontium and titanium trioxide ($SrTiO_3$), alumina ($Al_2O_3$), zirconium dioxide ($ZrO_2$), tantalum pentoxide ($Ta_2O_5$), titanium dioxide ($TiO_2$), their nitrides and their silicides.

According to various embodiments, the plasma activation can comprise applying an oxygen plasma to the first insulating layer, the second insulating layer, or both layers at a flow rate of from 50 sccm to 200 sccm in an activation chamber while maintaining a pressure inside the chamber of 50 mTorr and supplying a plasma power of about 250 W for 200 mm substrates and about 500 W for 300 mm substrates, for a period of from 5 seconds to 60 seconds.

The method can further comprise annealing, prior to plasma activation, at least one of the source substrate or the support substrate with its respective insulating layer in a mixture of neutral gas and hydrogen, at a temperature of about 900° C., for a period of at least two hours.

The method also provides for removing the back portion by grinding or polishing the back portion. In some embodiments, the method comprises forming a zone of weakness inside the source substrate prior to the plasma activation and removing the back portion by detaching the back portion along the zone of weakness. The zone of weakness can be formed by implanting atomic species into the source substrate after providing the second insulating layer on the source substrate. The method also provides for annealing, prior to the implanting of the atomic species, the source substrate with the second insulating layer in a mixture of neutral gas and hydrogen, at a temperature of about 900° C., for a period of at least two hours The method can further provide for thinning at least one of the first and second insulating layers, after plasma activation and prior to bonding.

A composite substrate comprising at least one final insulating layer interposed between a first support substrate of semiconductor material and an active layer of semiconductor material is provided. In the composite substrate, the final insulating layer has a total thickness of 50 nm or less, and a density of interface trap (DIT) value of $10^{11} \cdot eV^{-1} \cdot cm^{-2}$ or less, at both the final insulating layer's interface with the support substrate and the final insulating layer's interface with the active layer.

The final insulating layer can comprise an oxide. The final insulating layer can comprise a high permittivity dielectric material. The active layer can comprise a material selected from silicon (Si), germanium (Ge), silicon carbide (SiC), gallium nitride (GaN), and silicon germanium (SiGe). In some embodiments, the total thickness of the final insulating layer is 20 nm or less. Preferably, the DIT value is several $10^{10} \cdot eV^{-1} \cdot cm^{-2}$ or less, at both the final insulating layers interface with the support substrate and the final insulating layer's interface with the active layer.

BRIEF DESCRIPTION OF THE DRAWINGS

Other characteristics and advantages of the invention become apparent from the following description made with reference to the accompanying drawings, which represent a possible implementation and its variations in an indicative but non-limiting manner.

In the drawings.

DETAILED DESCRIPTION OF THE PREFERRED EMBODIMENTS

Figure 1A:
FIGS. 1A to 1E illustrate the various steps in fabrication of an SOI type substrate, in accordance with a known prior art implementation.
Figure 1B:
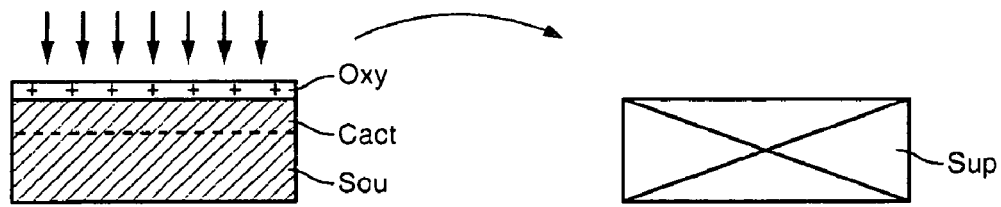
Figure 1C:
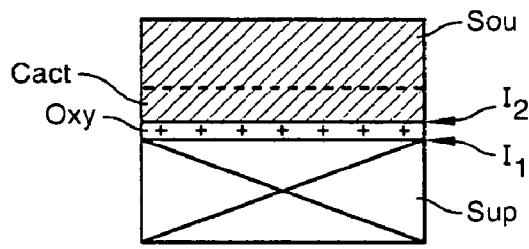
Figure 1D:
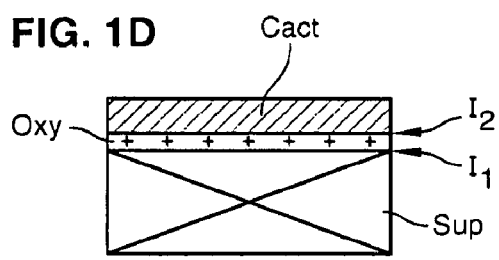
Figure 1E:
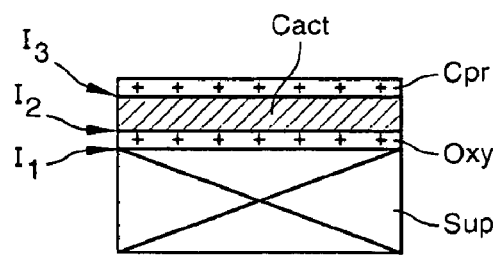

In the description and claims below, the term "insulator" designates an electrically insulating material optionally having a high dielectric permittivity.

To this end, the present invention concern a method of fabricating a composite substrate of the type comprising a thin insulating layer, termed the "final layer", interposed between a first semiconductor substrate, termed the "support substrate", and a layer of semiconductor material termed the "active layer", characterized in that it comprises the steps of:

forming or depositing an insulating layer, termed the "first layer", on the support substrate and an insulating layer, termed the "second layer", on a second substrate, termed the "source substrate";

plasma activation of at least one of the first and second insulating layers;

bonding the support substrate and the source substrate together by molecular bonding, such that the first and second insulating layers are in contact along a bonding interface and together form the final insulating layer; and lifting off a portion termed the "back" of the source substrate, to retain only a thickness of material constituting the active layer;

wherein the value of the plasma activation energy and respective thicknesses ($e_1$, $e_2$) of the first and second insulating layers being selected such that the activated insulating layer is activated only in its upper portion extending from its free surface, and the thickness of the final insulating layer is 50 nanometers (50 nm) or less, preferably 20 nanometers (20 nm) or less.

In some embodiments of the method, the thickness ($e_1$) of the first insulating layer formed or deposited on the support substrate and the thickness ($e_2$) of the second insulating layer formed or deposited on the source substrate satisfy the following relationships:

$$e_1 \geq e_{mp1} + d_1 \text{ and } e_2 \geq e_{mp2} + d_2$$

in which $e_{mp1}$ and $e_{mp2}$ respectively correspond to the thickness of the first insulating layer and to the thickness of the second insulating layer the nature of which is modified after the plasma activation treatment, and $d_1$ and $d_2$ correspond to the respective tunneling distances of the first and the second insulating layers.

In some embodiments of the method, the first and second insulating layers have density of interface trap values (DIT) of $10^{11}$ eV$^{-1}$·cm$^{-2}$ or less, preferably several $10^{10}$ eV$^{-1}$·cm$^{-2}$ or less, at their respective interfaces with the layers on which they are deposited or formed, when these latter are formed from silicon and the insulating layers are formed from silicon dioxide ($SiO_2$).

In some embodiments of the method, the first insulating layer and/or the second insulating layer is/are formed from an oxide or a dielectric material with a high permittivity.

In some embodiments of the method, plasma activation consists of applying an oxygen plasma to the first and/or the second insulating layer(s) at a flow rate in the range 50 sccm to 200 sccm, a pressure inside the chamber of 50 mTorr, a plasma power of about 250 W for 200 mm substrates and about 500 W for 300 mm substrates, for a period in the range 5 seconds to 60 seconds.

The method may also comprise an annealing step carried out in a mixture of neutral gas and hydrogen, at a temperature close to 900° C., for a period of at least two hours, on at least one of the two substrates covered with its insulating layer, wherein the annealing is carried out before plasma activation.

Advantageously, the back portion of the source substrate is lifted off by grinding and/or polishing. The method may also comprise forming a zone of weakness inside the source substrate, carried out before the plasma activation step, and lifting off the back portion of the source substrate by detachment along the zone of weakness.

Advantageously, the zone of weakness is formed by atomic species implantation in the source substrate. In this latter case, if the above-mentioned annealing step is carried out, it is carried out before the implantation step.

The present invention is of particular application to the fabrication of a SOI substrate, in which the source substrate is formed from silicon and the first and second insulating layers are formed from silicon oxide.

The present invention also concern a composite substrate which comprises at least one insulating layer interposed between a first semiconductor substrate termed the "support substrate" and a layer of semiconductor material, termed the "active layer", the insulating layer or layers forming an insulating layer termed the "final" layer, having a total thickness of 50 nanometers (50 nm) or less, preferably 20 nanometers or less, and having density of interface trap values (DIT) of $10^{11}$·eV$^{-1}$·cm$^{-2}$ or less, more preferably $10^{10}$·eV$^{-1}$·cm$^{-2}$ or less, at its interface with the support substrate and at its interface with the active layer.

Figure 2A:
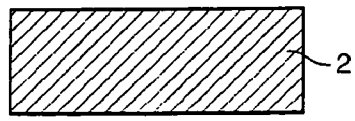
FIGS. 2A to 2E illustrate the various steps in a fabrication method in accordance with a first implementation of the invention.
Figure 2A:
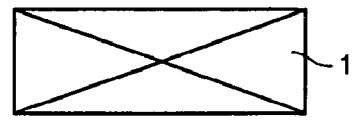
Figure 2B:
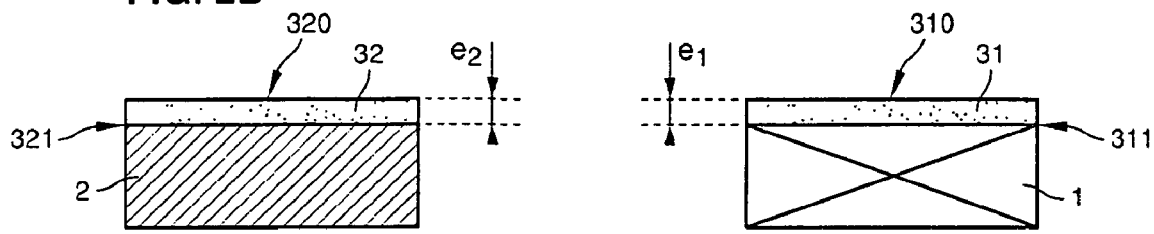

FIG. 2A illustrates a method of the present invention. A first substrate 1 termed a "support substrate" and a second substrate 2 termed a "source substrate" are utilized. As can be seen in FIG. 2B, an insulating layer 31 termed a "first insulating layer" having a thickness $e_1$ is formed or deposited on support substrate 1 and an insulating layer 32 termed a "second insulating layer" having a thickness $e_2$ is formed on source substrate 2.

An interface 311 is defined between insulating layer 31 and support substrate 1. An interface 321 is defined between second insulating layer 32 and source substrate 2. Insulating layers 31, 32 further comprise free surfaces or faces 310, 320, respectively.

Figure 2C:
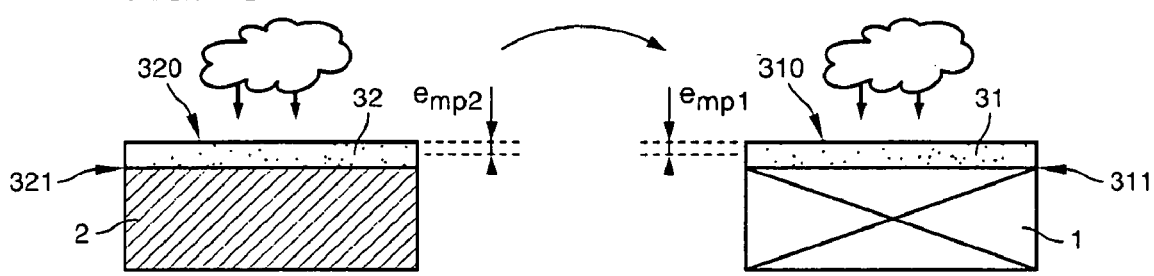

As seen in FIG. 2C, plasma activation of at least one of the two insulating layers 31, 32 is then carried out. During plasma treatment, surfaces or faces 310 and/or 320 of at least one of the two insulating layers 31, 32 undergo ionic bombardment which modifies the treated insulator over a thickness $e_{mp}$ (thickness modified by plasma treatment).

These thicknesses, with references $e_{mp1}$ or $e_{mp2}$ depending on whether they concern first insulating layer 31 or second insulating layer 32, may be adjusted as a function of the power used to apply the plasma and the exposure time for that plasma. As noted above, at least one but preferably the thicknesses of both layers are activated.

Surfaces 310 and 320 are then prepared for bonding carried out by molecular bonding (see FIG. 2D) to a form a bonding interface 5.

Figure 2D:
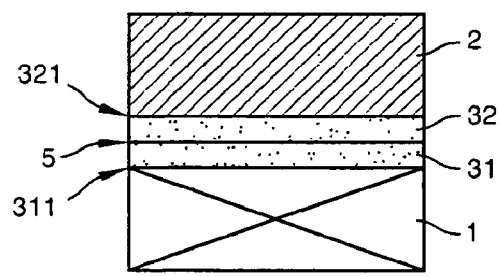
Figure 2E:
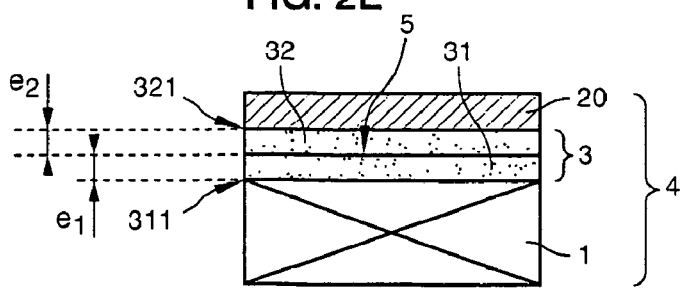

Finally, a portion of source substrate 2 termed a "back" portion (not shown) can then be lifted off or removed, leaving only a thickness of source substrate 2 that constitutes an active layer 20, in a final composite substrate 4 (see FIG. 2E).

In composite substrate 4, support substrate 1 can act as a mechanical support, as is usually the case in the prior art. Further, support substrate 1 can also form an integral part of electronic components that can subsequently be fabricated on a surface, for example an outer surface, of composite substrate 4. In the present invention, when a material with a low DIT value is to be obtained at interface 311, between the insulator 31 and the support substrate 1, the nature and the physical characteristics of the material constituting support substrate 1 influences the electrical performances of the electronic components subsequently to be fabricated. For this reason, support substrate 1 is advantageously formed from a semiconductor material.

Further, it is even possible for support substrate 1 to comprise elements which can be constituents of any final electronic components, for example electrodes, a ground plane, a channel, subsequently formed.

In some embodiments, support substrate 1 can comprise a composite substrate that can be used to produce a multi-layer structure. Purely by way of illustrative example, a bulk silicon substrate with an epitaxial layer of silicon germanium (SiGe) containing 20% germanium may be provided as a support substrate.

Active layer 20 of composite substrate 4 can be derived from source substrate 2 as is described below. Source substrate 2 can also be formed from semiconductor material.

Various examples of materials may be used as substrates 1 and 2. Support substrate 1 can comprise silicon (Si), silicon carbide (SiC), germanium (Ge), any epitaxially grown layer, for example a layer of germanium (Ge), silicon germanium (SiGe) or gallium nitride (GaN) on a silicon substrate, or even a layer of strained silicon. Source substrate 2 can comprise silicon (Si), germanium (Ge), silicon carbide (SiC), gallium nitride (GaN), silicon germanium (SiGe), gallium arsenide (AsGa) or indium phosphide (InP).

Insulating layers 31, 32 can comprise layers of oxide or nitride, such as silicon oxide ($SiO_2$) or silicon nitride ($Si_3N_4$); germanium oxynitride ($Ge_xO_yN_z$); high permittivity (high k) dielectric materials such as hafnium dioxide ($HfO_2$), yttrium oxide ($Y_2O_3$), strontium and titanium trioxide ($SrTiO_3$), alumina ($Al_2O_3$), zirconium dioxide ($ZrO_2$), tantalum pentoxide ($Ta_2O_5$), titanium dioxide ($TiO_2$), their nitrides and their silicides.

The nature of each insulating layer 31 or 32 is selected firstly to optimize the electrical performances of interfaces 311 and 321, and secondly as a function of the nature of the materials used for support substrate 1 and source substrate 2. By way of example, to produce a final substrate of Germanium on Insulator (GeOI) type, a thin layer of silicon oxide may be formed on the silicon support substrate and a layer of $HfO_2$ on the germanium source substrate.

Preferably, insulating layers 31, 32 are of excellent quality with regard to their electrical properties. More precisely, insulating layers 31, 32 have DIT values at interfaces 311 and 321, which are as low as possible.

By way of illustrative example, when support substrate 1 and source substrate 2 formed from silicon, and insulating layers 31, 32 formed from silicon dioxide are used to form a composite substrate according to the present invention, DIT values at interfaces 311 and 321 are $10^{11} \cdot eV^{-1} \cdot cm^{-2}$ or less, or even $10^{10} \cdot eV^{-1} \cdot cm^{-2}$ or less.

When the insulator is an oxide, it is formed with all precautions taken to form oxides of optimum quality, such as gate oxides. Reference in this regard is made to the article by Green et al, "*Ultrathin (<4 nm) $SiO_2$ and Si—O—N gate dielectric layers for silicon microelectronics: Understanding the processing, structure and physical and electrical limits*", Journal of Applied Physics, volume 90, n° 5, Sep. 1, 2001, pages 2086 ff.

The surfaces of substrates 1 and 2 on which the oxide is to be formed are prepared by deep cleaning, for example using a treatment in an "RCA" chemical, to prevent any contamination. "RCA" treatment consists of treating the surfaces in succession with the following: a first solution standard clean 1 (SC1), which comprises a mixture of ammonium hydroxide ($NH_4OH$), hydrogen peroxide ($H_2O_2$) and de-ionized water; and a second solution standard clean 2 (SC2), which comprises a mixture of hydrochloric acid (HCl), hydrogen peroxide ($H_2O_2$) and de-ionized water.

The insulating layers 31, 32 or oxides are then obtained by an oxidation heat treatment of the support substrate 1 and/or the source substrate 2, optionally followed by a post-oxidation treatment of the "forming gas anneal" (FGA) type.

The insulating layers 31, 32 may also be obtained by Low Pressure Chemical Vapor Deposition (LPCVD) or by an Atomic Layer Deposition (ALD) method. The deposition may optionally be preceded by a surface passivation treatment of substrates 1 or 2. As an example, the passivation treatment may consist of forming several silicon dioxide ($SiO_2$) monolayers on silicon prior to depositing an insulating layer 31 or 32 of hafnium dioxide ($HfO_2$).

The characteristics of the thicknesses $e_1$ and $e_2$ of the insulating layers 31, 32 are described below.

The plasma activation treatment (FIG. 2C) is carried out under conditions which preserve the electrical characteristics and in particular the DIT values of the interface between the insulating layer and the neighboring layer. "Plasma activation" of a surface is defined as exposing that surface to a plasma, which may in particular be carried out in a chamber under vacuum or at atmospheric pressure. The activation is carried out by controlling various exposure parameters such as the nature, the flow rate or the pressure of the gas supplied to the chamber inside which activation is carried out, as well as the applied power. The flow rate of the gas used is a function of the volume of the activation chamber and the size of the substrate.

In the present invention, the substrate covered with the insulating layer to be activated is introduced into the chamber, then a pure gas, typically oxygen ($O_2$), optionally nitrogen ($N_2$), argon (Ar) or helium (He) or a mixture of the gases, such as oxygen and helium, oxygen and argon or helium and nitrogen, for example, is sent into the chamber.

Preferably, the gas is sent in at a flow rate in the range 10 standard cubic centimeter per minute (sccm) to 1000 sccm, typically in the range of from about 50 sccm to about 200 sccm. By way of example, a flow rate of 75 sccm for a 200 mm diameter substrate is used, while a flow rate of 200 sccm is used for a 300 mm diameter substrate.

The pressure established in the chamber during plasma treatment is controlled, so that it is in the range 10 mTorr to 200 mTorr, typically close to 50 mTorr (1 mTorr being equal to $1.33 \times 10^{-1}$ Pa).

The plasma is initiated then maintained by application of radiofrequency (RF) power in the range from 100 W to 2000

W, preferably close to 250 W in the case of 200 mm diameter substrates and in the range 100 W to 3000 W, preferably close to 500 W in the case of 300 mm diameter substrates.

The surface of the insulating layer is then exposed to plasma for 5 to 60 seconds, preferably 10 to 30 seconds.

During plasma treatment, the surfaces 310 and/or 320 of the insulators undergo ionic bombardment which modifies the treated insulator over a thickness $e_{mp}$ (thickness modified by plasma treatment). These thicknesses, with references $e_{mp1}$ or $e_{mp2}$ depending on whether they concern the first insulating layer 31 or the second 32, may be adjusted as a function of the power used to apply the plasma and the exposure time for that plasma.

Each insulating layer 31, 32 is modified solely in its upper portion, i.e. the portion in the figures which extends from free surface 310 or 320, respectively.

Figure 4:
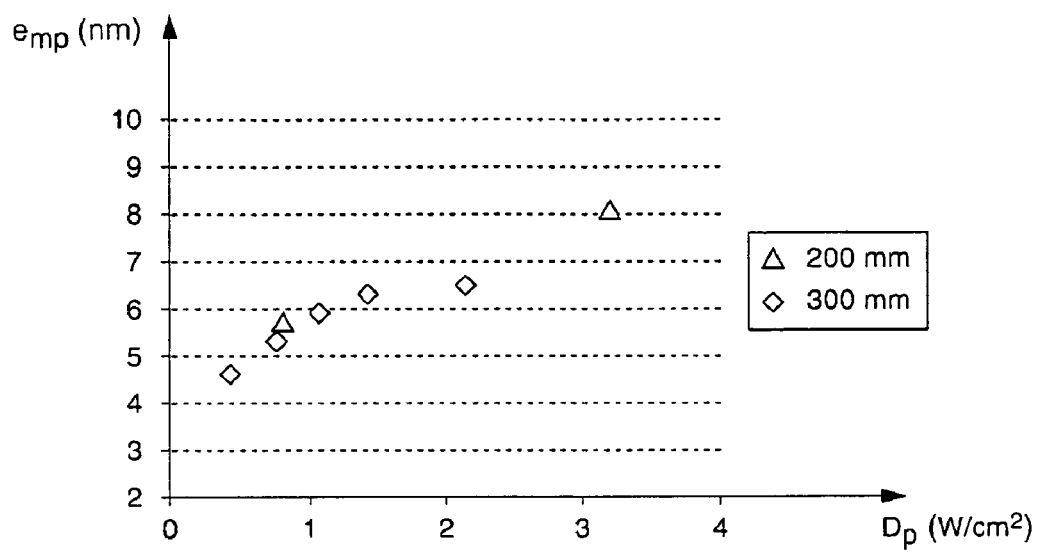
FIG. 4 is a graph showing a thickness $e_{mp}$ of a insulating layer which is modified after plasma activation treatment as a function of a power density $D_P$ applied to generate plasma, for two substrates with different diameters.

Measurements were carried out to determine the thickness $e_{mp}$ of the insulating layer which is modified by the plasma treatment, as a function of the density $D_P$ of the power of the applied plasma, expressed in W/cm$^2$, for a period of 30 seconds. These measurements were carried out on a layer of silicon oxide, the plasma being an oxygen plasma. The results obtained are shown in the accompanying FIG. 4. The results represented as a triangle correspond to those obtained with substrates with a diameter of 200 mm, and those represented by a diamond correspond to those for 300 mm diameter substrates.

These results show that the plasma treatment may result in a modification to the nature of the oxide layer over a thickness of 8 nm. Complementary measurements have shown that this thickness may be greater, for example for a higher power density.

As a result, to prevent the plasma treatment from affecting the DIT values of the interfaces 311, 321, it is necessary to form insulating layers having thicknesses $e_1$ or $e_2$ which are greater than the respective thicknesses $e_{mp1}$ and $e_{mp2}$ modified by the plasma. Hence, preferably, the thicknesses $e_1$ and $e_2$ of the insulating layers 31, 32 satisfy the following relationships:

$$e_1 \geq e_{mp1} + d_1$$

$$e_2 \geq e_{mp2} + d_2$$

in which $d_1$ and $d_2$ respectively represent the "tunneling" distances of the first and second insulating layer 31, 32.

Each insulator is thus thicker than the portion which can be perturbed by the plasma treatment, taking at least the tunneling distance as a safety thickness.

Figure 5:
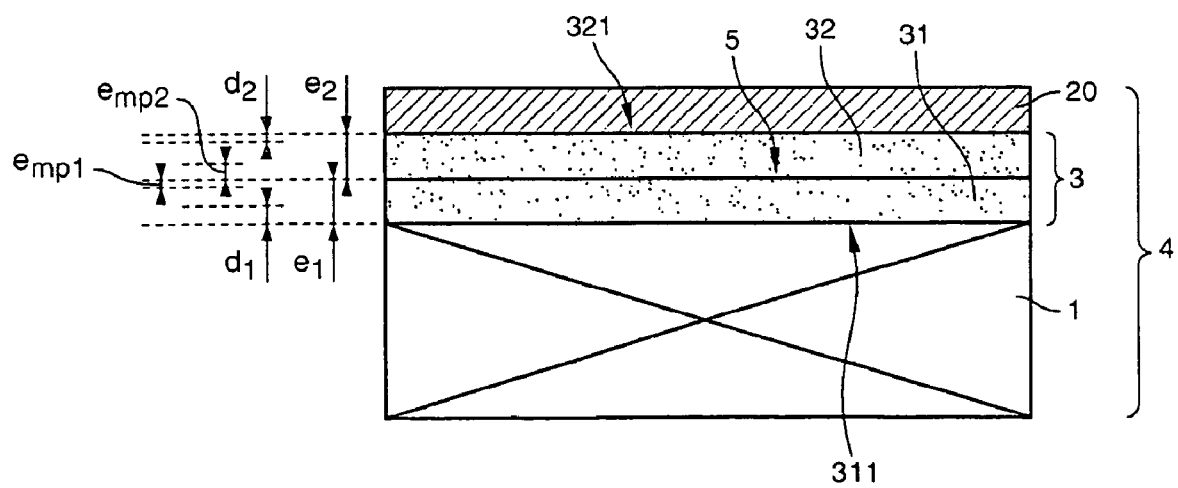
FIG. 5 is an enlarged view of FIGS. 2E and 3E showing the "tunneling" distances.

In the remainder of the description and claims, the tunneling distance $d_1$ or $d_2$ is defined as being the distance from the interface 311 or 321, respectively, beyond which the traps or defects created by the plasma are not capable of being charged by the "tunneling" effect when an electronic component fabricated from composite substrate 4 is used. An enlarged view of the tunneling distances $d_1$ and $d_2$ is shown in FIG. 5.

In other words, the defects created by the plasma are sufficiently far away from interfaces 311 or 321 to have no significant influence thereon. The tunneling distance $d_1$ or $d_2$ depends on the nature of the materials constituting the insulator, the source and support substrates, and also depends on the types of electronic components produced. In an insulator, tunneling distance is dependent on the electric field around an electrical interface.

The skilled person will be able to determine the value of $d_1$ and $d_2$ depending on the values of these parameters. As an example, the tunneling distance is approximately 2 nm for an oxide of Si (SiO$_2$) on silicon, in the voltage range used in CMOS technology.

Further, the thickness $e_1$ of the first insulating layer 31 and the thickness $e_2$ of the second insulating layer 32 are determined so that the total thickness of the final insulating layer 3 of the composite substrate 4 preferably does not exceed 50 nm or more preferably 20 nm. The thickness of this final layer 3 approximately corresponds to the sum of $e_1$ and $e_2$. However, it should be noted that it is also possible to thin one or both of the insulating layers 31, 32 slightly, after the plasma treatment and before bonding. This thinning step is described below.

Finally, when the insulating layer used is a high dielectric permittivity material, i.e. a material for which the relative permittivity $\in_r$ is significantly higher than that of SiO$_2$ (for which $\in_r$ is close to 3.9), it is routine to convert its thickness e into the Equivalent Oxide Thickness (EOT), using the formula:

$$EOT = (\in_{SiO2}/\in_r) \cdot e$$

In so far as the present invention are applicable to forming a thin insulating layer 3 (<50 nm) regardless of its nature, it is understood that if this insulating layer is formed by a layer with a high dielectric permittivity, this can result in a very low EOT.

It is also appropriate to limit the exposure time for the plasma treatment to what is strictly necessary. Preferably, this is less than one minute, or better still less than 30 seconds.

Prolonged exposure would risk causing an accumulation of electric charges in the insulator and an increase in the charge density of the insulator (Qbox), which will counter the improvements in electrical performances discussed in the introduction.

Respective management of plasma activation treatment parameters and the thicknesses of the two insulating layers 31 and 32 can guarantee that the defects created by the plasma treatment will be far away from interfaces 311 or 321, respectively.

In the implementation illustrated in FIGS. 2D and 2E, the back portion of source substrate 2 is lifted off by grinding and/or polishing.

A variation of this method is described with reference to FIGS. 3A to 3E. Only those steps concerning lifting off the back portion, which have been modified, are described in detail.

Figure 3A:
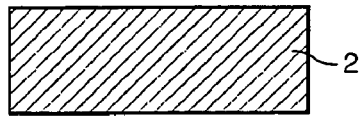
FIGS. 3A to 3E illustrate a variation of the method illustrated in FIGS. 2A to 2E.
Figure 3A:
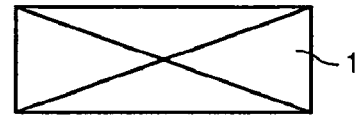
Figure 3B:
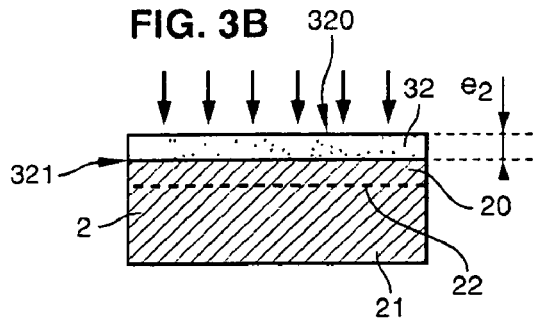
Figure 3B:
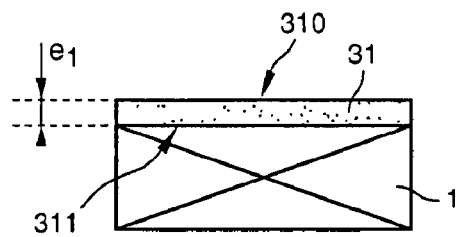
Figure 3C:
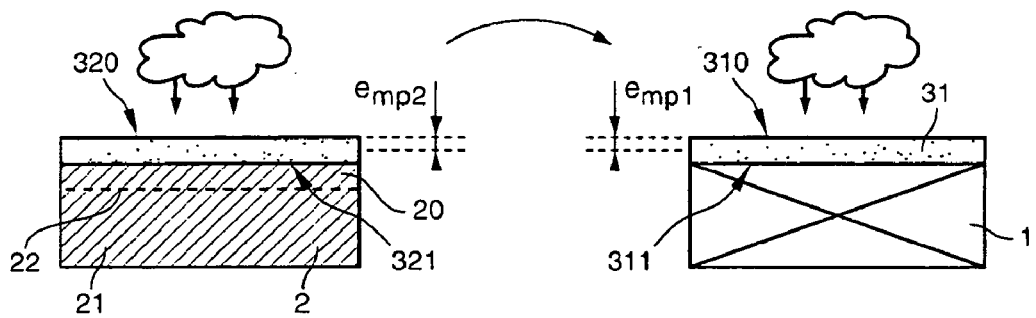
Figure 3D:
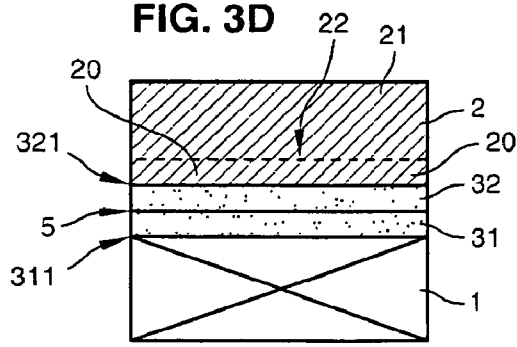

As can be seen in FIG. 3B, a zone of weakness 22 is formed within a source substrate 2. The zone of weakness delimits the active layer 20 from the back portion 21 of substrate 2.

The zone 22 may be formed by a porous zone; in this regard, reference is made to the article by K. Sakaguchi et al, "*Eltran® by splitting porous Si layers,*" The ElectroChemical Society Inc PV99-3, Silicon-on-insulator technology and devices, P. L. Hemment, pp 117-121. In this case, the porous zone is formed prior to depositing the layer 32.

Zone of weakness 22 is advantageously formed by implantation of light atomic species, preferably hydrogen and/or helium ions, so as not to deteriorate the thin oxide 32. Reference is made to the article by C. Maleville and C. Mazuré, "*Smart Cut™ technology: from 300 nm ultrathin SOI production to advanced engineered substrates*", Solid State Electronics 48 (2004), 1055-1063, for implantation conditions.

It should be noted that, although it is not shown in the figures, it is also possible to carry out the atomic species implantation step taking care to deposit or form a protective layer of oxide or nitride on the insulating layer 32.

The nature of the additional protective layer is selected so as to facilitate its selective lifting off, without ruining the subjacent insulating layer. This lifting off may, for example, be carried out by selective etching.

As an example, if the insulator formed is $SiO_2$, it is possible to deposit a protective layer of silicon nitride ($Si_3N_4$). This protective layer can subsequently be eliminated prior to the bonding step. When this protective layer is retained during plasma activation, its thickness should be taken into account when selecting the suitable plasma power.

The power may be selected to be higher, all the while paying attention to the tunneling distance, the higher power in some cases producing higher energy bonding.

The plasma activation and bonding steps are then carried out as described above (see FIGS. 3C, 3D). Prior to carrying out the plasma treatment, specific cleaning precautions are taken to ensure the elimination of particles and metallic contaminants which can generate defects, for example charges in the insulator (Qbox). To clean $SiO_2$ surfaces, as described above, a "RCA" solution is used, this solution comprising a step for cleaning using a SC2 solution (which is known to eliminate these contaminants).

Figure 3E:
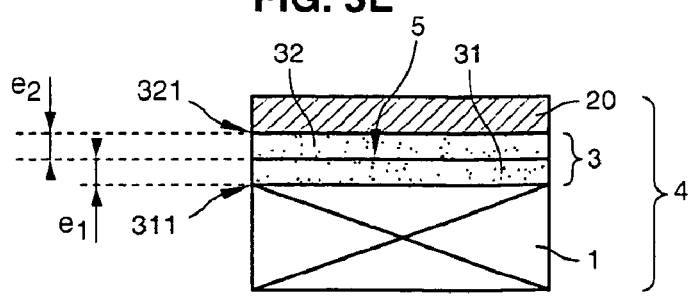

Finally, as shown in FIG. 3E, the step for detaching a back portion 21 along zone 22 consists of applying stresses of thermal or mechanical origin, for example an anneal or introduction of a blade at zone of weakness 22.

In a variation of the two above-mentioned implementations, described with reference to FIGS. 2 and 3, in particular if a very thin insulating layer (of the order of 5 nm) is to be made, the insulating layer or layers 31, 32 may be thinned after the plasma treatment and prior to bonding.

Care is taken not to remove a thickness beyond which the "strong bonding" effect of the plasma would be lost. Hence, it is known that beyond a thinning of 5 to 10 Angstroms in a layer of $SiO_2$ activated by plasma, this effect starts to disappear. It disappears completely upon thinning beyond 40 Angstroms. In the case of $SiO_2$, a SC1 solution may be used to etch and eliminate a selected thickness of oxide. This step based on SC1 can combine the effects of cleaning and etching of this solution.

In another variation of the two above-mentioned methods, described with reference to FIGS. 2 and 3, after forming insulating layers 31, 32 and prior to the plasma activation step and prior to any atomic species implantation, it is also possible to carry out a Forming Gas Anneal (FGA) type treatment.

The FGA heat treatment is advantageously carried out in a neutral gas and hydrogen atmosphere at a temperature close to 450° C. for a period in the range from about 30 minutes to several hours.

It is also possible to carry out a heat treatment in a neutral gas at a higher temperature, for example over 900° C. for $SiO_2$, in argon. The heat treatments may be carried out on one or the other or both substrates 1 and 2.

The method of the present invention has the advantage of producing the bonding interface 5 at a sufficiently large distance from the two interfaces 311 and 321, thus retaining low density of interface trap values (DIT). In accordance with the present invention, it is also important to form an insulating layer 31, 32 on each of substrates 1, 2 to be bonded, as otherwise the bonding interface which would then exist between the insulator and the substrate not covered with insulator would have DIT values which would be too high and would thus have mediocre electrical properties that are insufficient for the envisaged applications.

EXAMPLES

Examples of preferred implementations are described below.

Example 1

Preparation of an SOI Type Substrate with an Oxide Laver Thickness of 25 nm

Thermal oxidation of a 200 mm diameter silicon substrate was carried out to form a 10 nm thick insulating layer of silicon oxide ($SiO_2$) thereon. In a similar manner, a 15 nm thick silicon oxide layer was formed on a silicon source substrate of the same size. Next, the two substrates underwent FGA heat treatment to arrive at the electrical properties of the two oxides.

The silicon source substrate then underwent a hydrogen ion implantation step, carried out through the silicon oxide layer covering it. Implantation was carried out at a dose of $5.5 \times 10^{16}$ $H^+/cm^2$ using an implantation energy of 35 keV.

Next, the upper surface of the substrate was cleaned with a SC1 solution then with SC2 in succession.

The silicon oxide layer of the source substrate thus prepared then underwent an oxygen plasma activation treatment applied for 30 seconds at a power density of 0.8 $W/cm^2$, at an oxygen pressure of 50 mTorr (6.66 Pa), a flow of 75 sccm (standard cubic centimeter), at 20° C..

Plasma activation modified the nature of the oxide layer over a maximum thickness of 5.5 nm. It was thus observed that the thickness of the oxide, which was 15 nm, was substantially greater than the thickness treated by the plasma plus the tunneling distance d, which was 2 nm. Thus, the above-mentioned mathematical relationship is satisfied.

The surfaces to be brought into contact were then cleaned by rinsing with chemicals and/or scrubbing, then bonded by molecular bonding.

Finally, heat treatment was carried out for several hours at a temperature in the range 350° C. to 600° C. to separate and detach the back portion of the source substrate from the active layer.

After detachment, the surface of the SOI substrate was finished (i.e. steps of stabilization, thinning and polishing).

The DIT values of interfaces 311 and 321 prior to the plasma activation treatment were respectively of the order of a few $10^{10} \cdot eV^{-1} \cdot cm^{-2}$.

The final composite substrate obtained had DIT values of the same order of magnitude for interfaces 311 and 321 respectively.

Identical results were obtained for 300 mm diameter silicon substrates using a flow of 150 sccm (standard cubic centimeter).

Example 2

Preparation of an SOI Type Substrate with an Oxide Thickness of 11 nm

The procedure of Example 1 was used, respectively with oxide thicknesses of 3 nm on the support substrate and 10 nm on the source substrate. The oxides obtained were then treated at 450° C. for about 1 hour in an atmosphere formed by 2% hydrogen in argon (FGA treatment) to improve the DIT values.

The source substrate, which comprised the thickest oxide layer, was activated by plasma at a power of 2 $W/cm^2$, resulting in a modification of the oxide over about 7 nm.

This plasma treated insulating layer was cleaned in a SC1 solution using a concentration, temperature and time sufficient to etch it over a depth of the order of 2 nm. The final composite substrate obtained was an SOI type structure which comprised a buried insulating layer with a thickness on the order of 11 nm and which had good electrical qualities, in particular a DIT of the order of several $10^{10} \cdot eV^{-1} \cdot cm^{-2}$.

Example 3

Preparation of a GeOI Type Substrate with an Oxide Thickness of 20 nm

A 5 nm layer of $HfO_2$ was formed on a 200 mm diameter source substrate of bulk germanium. In a variation, the source substrate may consist of a 200 mm silicon wafer on which a layer of germanium has been formed by epitaxy.

A 15 nm layer of silicon oxide ($SiO_2$) was formed on a silicon (Si) support substrate.

The silicon oxide layer of the support substrate then underwent an oxygen plasma activation treatment applied for 30 seconds with a power density of 0.4 W/cm² at an oxygen pressure of 50 mTorr (6.66 Pa), with a flow rate of 75 sccm, at 20° C..

Bonding was then carried out followed by lifting off the upper portion of the germanium source substrate by detachment using the SmartCut® method. A GeOI substrate was obtained with a DIT value of the order of several $10^{11} \cdot eV^{-1} \cdot cm^{-2}$ at the interface with the germanium and several $10^{10} \cdot eV^{-1} \cdot cm^{-2}$ at the interface with the silicon.

It should be noted that the DIT value obtained is higher than in the preceding examples, because currently, the surface preparation of germanium (Ge) and the selection of suitable insulators for these materials have not been completely mastered. It is possible that in the future, a more judicious choice of surface treatments and materials selected as insulators and their formation conditions might result in lower DIT values. The invention herein can be adapted to changes in technology.

Example 4

Preparation of a Composite Substrate

The procedure of Example 3 was carried out, except that the support substrate was not a bulk silicon substrate but a hybrid SOI type substrate. It was formed from a silicon support substrate, a 150 nm buried $SiO_2$ layer and a superficial 100 nm layer of silicon (Si).

The superficial layer of the hybrid support substrate was oxidized over about 10 nm to form a silicon oxide with a thickness of the order of 20 nm.

Next, plasma activation, bonding and lifting off the back portion of the source substrate were carried out as described in the preceding example. Finally, a composite structure was formed with the following structure, in succession: the support substrate; a 150 nm silicon oxide insulator; a 90 nm Si layer; a 20 nm oxide layer; a 5 nm $HfO_2$ layer; and a final Ge layer.

Example 5

Preparation of a Double SOI Type Substrate Wherein Each of the Buried Insulating Layers is Thin Example 1 was carried out once, and then a second time using as the support substrate the SOI substrate obtained the first time at the end of the method of Example 1.

A composite substrate was thus obtained containing, in succession: the support substrate; a 25 nm silicon oxide insulator; a 50 nm Si layer; a 25 nm silicon oxide layer; and a 50 nm final silicon layer.

The composite substrates obtained in accordance with Examples 4 and 5 had good electrical performances at each of its interfaces, even the deepest, which could not be achieved with a final FGA type treatment.

What is claimed is:

1. A method of fabricating a composite substrate, which comprises:

providing a first insulating layer on a support substrate at a thickness of $e_1$ and providing a second insulating layer on a source substrate at a thickness of $e_2$, with each layer having an exposed face for bonding;

providing plasma activation energy in an amount sufficient to activate one of a portion of the thickness of the face of the first insulating layer $e_{mp1}$ or a portion of the thickness of the face of the second insulating layer $e_{mp2}$;

providing a final insulating layer by molecular bonding the face of the first insulating layer with the face of the second insulating layer; and removing a back portion of the source substrate while retaining an active layer comprising a remaining portion of the source substrate bonded to the support substrate with the final insulating layer interposed therein to form the composite substrate;

wherein the thicknesses $e_1$, $e_2$ of the first and second insulating layers are sufficient to provide the final insulating layer with a thickness of 50 nanometers or less, and the plasma activation energy and respective thicknesses $e_1$, $e_2$ of the first and second insulating layers are selected such that only at least one of the respective thicknesses $e_{mp1}$ and $e_{mp2}$ of the faces of the first insulating layer and the second insulating layer is activated, and wherein the first and the second insulating layers have respective tunneling distances of $d_1$ and $d_2$, and the following relationships are satisfied:

$e_1 \geq e_{mp1} + d_1$ and $e_2 \geq e_{mp2} + d_2$.

2. The method of claim 1 wherein the plasma activation energy is provided in an amount sufficient to activate the thickness portions of each of the first and second insulating layers, with both respective thicknesses $e_{mp1}$ and $e_{mp2}$ of the faces of the first insulating layer and the second insulating layer are activated.

3. The method according to claim 1 wherein the first and second insulating layers have density of interface trap (DIT) values of $10^{11}$ $eV^{-1} \cdot cm^{-2}$ or less at their interfaces with the support and source substrates, respectively, when the support and source substrates comprise silicon, and the first and second insulating layers comprise silicon dioxide ($SiO_2$).

4. The method according to claim 3 wherein the DIT values are several $10^{10}$ $eV^{-1} \cdot cm^{-2}$ or less.

5. The method according to claim 1 wherein the first insulating layer, the second insulating layer, or both layers comprise an oxide that is formed or deposited on the support substrate, the source substrate, or both substrates, respectively.

6. The method according to claim 5, wherein the oxide of the first insulating layer, the second insulating layer, or both layers is obtained by thermal oxidation of the substrate or substrates.

7. The method according to claim 1 wherein the first insulating layer, the second insulating layer, or both layers comprise a high permittivity dielectric material that is formed or deposited on the support substrate, the source substrate, or both substrates, respectively.

8. The method according to claim 7, wherein the high permittivity dielectric material is selected from the group comprising hafnium dioxide ($HfO_2$), yttrium oxide ($Y_2O_3$), strontium and titanium trioxide (SrTiO$_3$), alumina (Al$_2$O$_3$), zirconium dioxide (ZrO$_2$), tantalum pentoxide (Ta$_2$O$_5$), titanium dioxide (TiO$_2$), and their respective nitrides or silicides.

9. A method of fabricating a composite substrate, which comprises:
   providing a first insulating layer on a support substrate at a thickness of e$_1$ and providing a second insulating layer on a source substrate at a thickness of e$_2$, with each layer having an exposed face for bonding;
   providing plasma activation energy in an amount sufficient to activate one of a portion of the thickness of the face of the first insulating layer e$_{mp1}$ or a portion of the thickness of the face of the second insulating layer e$_{mp2}$;
   providing a final insulating layer by molecular bonding the face of the first insulating layer with the face of the second insulating layer; and
   removing a back portion of the source substrate while retaining an active layer comprising a remaining portion of the source substrate bonded to the support substrate with the final insulating layer interposed therein to form the composite substrate;
   wherein the thicknesses e$_1$, e$_2$ of the first and second insulating layers are sufficient to provide the final insulating layer with a thickness of 50 nanometers or less, and the plasma activation energy and respective thicknesses e$_1$, e$_2$ of the first and second insulating layers are selected such that only at least one of the respective thicknesses e$_{mp1}$ and e$_{mp2}$ of the faces of the first insulating layer and the second insulating layer is activated,
   wherein plasma activation is provided by applying an oxygen plasma to the first insulating layer, the second insulating layer, or both layers at a flow rate of from 50 sccm to 200 sccm in an activation chamber, maintaining a pressure inside the chamber of 50 mTorr, and supplying a plasma power of about 250 W for 200 mm substrates and about 500 W for 300 mm substrates, for a period of from 5 seconds to 60 seconds.

10. A method of fabricating a composite substrate, which comprises:
    providing a first insulating layer on a support substrate at a thickness of e$_1$ and providing a second insulating layer on a source substrate at a thickness of e$_2$, with each layer having an exposed face for bonding;
    annealing at least one of the source substrate or the support substrate with its respective insulating layer in a mixture of neutral gas and hydrogen, at a temperature of about 900° C. for a period of at least two hours;
    providing, after annealing, plasma activation energy in an amount sufficient to activate one of a portion of the thickness of the face of the first insulating layer e$_{mp1}$ or a portion of the thickness of the face of the second insulating layer e$_{mp2}$;
    providing a final insulating layer by molecular bonding the face of the first insulating layer with the face of the second insulating layer; and
    removing a back portion of the source substrate while retaining an active layer comprising a remaining portion of the source substrate bonded to the support substrate with the final insulating layer interposed therein to form the composite substrate;
    wherein the thicknesses e$_1$, e$_2$ of the first and second insulating layers are sufficient to provide the final insulating layer with a thickness of 50 nanometers or less, and the plasma activation energy and respective thicknesses e$_1$, e$_2$ of the first and second insulating layers are selected such that only at least one of the respective thicknesses e$_{mp1}$ and e$_{mp2}$ of the faces of the first insulating layer and the second insulating layer is activated.

11. The method according to claim 10, wherein the removing comprises grinding or polishing the back portion.

12. The method according to claim 10, wherein the composite substrate comprises at least one final insulating layer interposed between a first interface with a first support substrate of semiconductor material and a second interface between an active layer of semiconductor material, wherein the final insulating layer has a total thickness of 50 nm or less, and a density of interface trap (DIT) value of $10^{11} \cdot eV^{-1} \cdot cm^{-2}$ or less, at both the first and second interfaces.

13. The method according to claim 10, wherein the final insulating layer comprises an oxide.

14. The method according to claim 10, wherein the active layer comprises a material selected from silicon (Si), germanium (Ge), silicon carbide (SiC), gallium nitride (GaN) and silicon germanium (SiGe).

15. The method according to claim 10, which further comprises forming a zone of weakness inside the source substrate prior to the plasma activation and wherein the removing comprises detaching the back portion along the zone of weakness.

16. The method according to claim 15, wherein the forming of the zone of weakness comprises implanting atomic species into the source substrate after providing the second insulating layer on the source substrate.

17. The method according to claim 16, wherein the annealing is conducted prior to the implanting of the atomic species.

18. The method according to claim 10, wherein the final insulating layer comprises a high permittivity dielectric material.

19. The method according to claim 18, wherein the high permittivity dielectric material is selected from the group comprising hafnium dioxide (HfO$_2$), yttrium oxide (Y$_2$O$_3$), strontium and titanium trioxide (SrTiO$_3$), alumina (Al$_2$O$_3$), zirconium dioxide (ZrO$_2$), tantalum pentoxide (Ta$_2$O$_5$), titanium dioxide (TiO$_2$), and their respective nitrides or silicides.

20. A method of fabricating a composite substrate, which comprises:
    providing a first insulating layer on a support substrate at a thickness of e$_1$ and providing a second insulating layer on a source substrate at a thickness of e$_2$, with each layer having an exposed face for bonding;
    providing plasma activation energy in an amount sufficient to activate one of a portion of the thickness of the face of the first insulating layer e$_{mp1}$ or a portion of the thickness of the face of the second insulating layer e$_{mp2}$;
    providing a final insulating layer by molecular bonding the face of the first insulating layer with the face of the second insulating layer; and
    removing a back portion of the source substrate while retaining an active layer comprising a remaining portion of the source substrate bonded to the support substrate with the final insulating layer interposed therein to form the composite substrate;
    wherein the thicknesses e$_1$, e$_2$ of the first and second insulating layers are sufficient to provide the final insulating layer with a thickness of 50 nanometers or less, and the plasma activation energy and respective thicknesses e$_1$, e$_2$ of the first and second insulating layers are selected such that only at least one of the respective thicknesses e$_{mp1}$ and e$_{mp2}$ of the faces of the first insulating layer and the second insulating layer is activated,
    wherein the first and second insulating layers have density of interface trap (DIT) values of $10^{11}$ eV$^{-1} \cdot$cm$^{-2}$ or less at their interfaces.

21. The method according to claim 20, wherein the DIT value is several $10^{10} \cdot eV^{-1} \cdot cm^{-2}$ or less, at both the first and second interfaces, and the support and source substrates comprise silicon, and the first and second insulating layers comprise silicon dioxide (SiO$_2$).

* * * * *

UNITED STATES PATENT AND TRADEMARK OFFICE
CERTIFICATE OF CORRECTION

PATENT NO. : 7,736,993 B2
APPLICATION NO. : 11/473404
DATED : June 15, 2010
INVENTOR(S) : Allibert et al.

It is certified that error appears in the above-identified patent and that said Letters Patent is hereby corrected as shown below:

Column 3:
Line 58, delete the equation and replace with the following equation:
$e_1 \geq e_{mp1} + d_1$ and $e_2 \geq e_{mp2} + d_2$.

Column 5:
Line 58, delete the equation and replace with the following equation:
$e_1 \geq e_{mp1} + d_1$ and $e_2 \geq e_{mp2} + d_2$.

Column 9:
Lines 42-44, delete the equation and replace with the following equation:
$e_1 \geq e_{mp1} + d_1$ $e_2 \geq e_{mp2} + d_2$.

Column 14:
Line 35, delete the equation and replace with the following equation:
$e_1 \geq e_{mp1} + d_1$ and $e_2 \geq e_{mp2} + d_2$.

Signed and Sealed this

Twenty-seventh Day of July, 2010

David J. Kappos
*Director of the United States Patent and Trademark Office*